United States Patent [19]

Trager

[11] Patent Number: 4,571,551
[45] Date of Patent: Feb. 18, 1986

[54] FLYBACK MODULATED SWITCHING POWER AMPLIFIER

[75] Inventor: Wesley H. Trager, Madison, N.J.

[73] Assignee: Washington Innovative Technology, Inc., Federal Way, Wash.

[21] Appl. No.: 584,363

[22] Filed: Feb. 28, 1984

[51] Int. Cl.⁴ ............................................. H03F 3/38
[52] U.S. Cl. ...................................... 330/10; 330/251
[58] Field of Search ......................... 330/9, 10, 51, 251

[56] References Cited

U.S. PATENT DOCUMENTS 4,326,170  4/1982  Levy ..................................... 330/10

Primary Examiner—Eugene R. LaRoche
Assistant Examiner—Steven J. Mottola
Attorney, Agent, or Firm—Blum, Kaplan, Friedman, Silberman & Beran

[57] ABSTRACT

A flyback modulated switching power amplifier is described. The amplifier employs a waveform generator to produce an input signal and power switches capable of controlled conduction in one direction and uncontrolled conduction in the other. An inductor is coupled to the power source through the power switches so that flyback current can flow through a switch in its uncontrolled direction from the inductor when the switch is turned off. A conduction feedback circuit detects conduction by the switches and a comparator detects whether the output is "too high" or "too low" relative to the input signal. A logic control selectively activates the switches to control the output voltage, but not until the last switch to be turned off has stopped all conduction, including flyback conduction.

21 Claims, 5 Drawing Figures

FIG. I 4,571,551

FLYBACK MODULATED SWITCHING POWER AMPLIFIER

BACKGROUND OF THE INVENTION

This invention relates generally to an electric power amplifier and, more particularly, to a switching power amplifier which minimizes switching transients normally associated with switching amplifiers.

Heretofore, switching amplifiers have been utilized which replace conventional linear amplifiers. In addition some amplifiers have used metal oxide silicon field effect transistor switches to replace bipolar transistors in the circuit design.

These designs have proven to be less than completely satisfactory in that the amplifier circuits thereof have a low throughput efficiency, require complex support circuitry to allow the amplifier to track the input signal and require output switching devices which can handle the large amounts of power they waste. High current capacity switching devices are necessary since earlier designs require the output switching elements to be able to absorb high switching transient currents.

The power is wasted each time the switches are cycled because earlier designs will turn on a switching device while the opposing device is conducting through its uncontrolled flyback diode. This diode will require some amount of time to recover and until it releases there will be an effective short-circuit across the supply. The energy that is drawn from the supply will be dissipated in one or both of the switching devices, thus a high speed switching amplifier will require fast recovery diodes and switching devices that can dissipate the power that is wasted.

Accordingly, it is desirable to provide a high-speed flyback modulated switching amplifier which eliminates the foregoing difficulties.

SUMMARY OF THE INVENTION

The amplifier includes a voltage comparator for comparing the input signal with the fed-back amplifier output signal, an inductive device coupled to the output, an output capacitor, and at least two power switches coupled between a power source and said inductive device, each being capable of controlling current flow in one direction while permitting uncontrolled current flow in the other direction when the inductive device releases its stored energy back into the supply and the output capacitor. A detection circuit indicates which switch is conducting and a logic control controls said switches in response to the comparator and said detecting circuit.

In a preferred embodiment, two such switches are coupled in series between the positive and negative rails of the power source, with the inductive device coupled between the junction of said switches and the amplifier output capacitor, and including a compacitive flyback device and detecting circuit associated with each switch.

The amplifier output voltage essentially tracks the wave form of the input signal, but at higher voltage levels, by alternately and at relatively high speed being raised to a level above and lowered to a level below the desired voltage level by operation of the power output switches. The speed of operation automatically adjusts to accommodate the characteristics of the inductive device, input and output voltages and load without the switching transients normally seen in power amplifiers.

Accordingly, it is an object of the invention to provide an improved switching power amplifier.

Another object of the invention is to provide an improved switching power amplifier which is flyback modulated.

A further object of the invention is to provide an improved switching power amplifier which minimizes all of the switching transients normally associated with switching amplifiers.

Yet another object of the invention is to provide an improved power amplifier which automatically "tunes" itself to compensate for possible circuit variations including unmatched power supply components and extreme power supply voltage ripple.

Still another object of the invention is to provide an improved switching power amplifier which has a through-put effeciency of up to 98% at 20 to 80% of its rated capacity.

Still other objects and advantages of the invention will in part be obvious and will in part be apparent from the specification.

The invention accordingly comprises the features of construction, combination of elements and arrangements of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
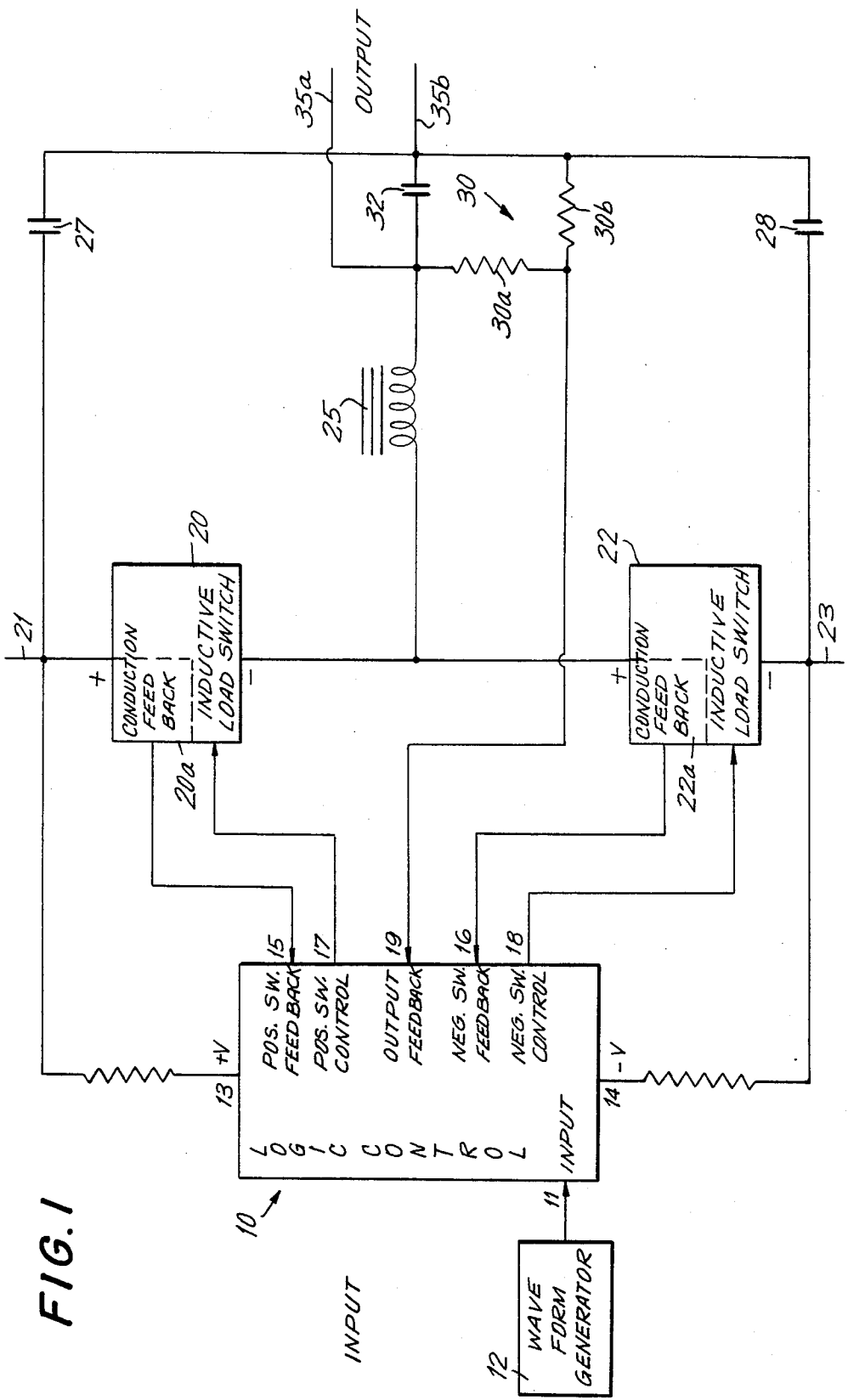
FIG. 1 is a block diagram of one embodiment of the invention.

Referring now to FIG. 1, a block diagram view of a flyback modulated switching power amplifier of the present invention is shown. A logic control system generally referred to as 10, is provided having a reference inpuut 11, a positive supply input 13, a negative supply input 14, a positive switch feedback input 15, a negative switch feedback input 16, a positive switch control output 17, a negative switch control output 18 and an amplifier output feedback input 19. A waveform generator 12 is coupled to reference input 11, the waveform generator being adapted to produce a low voltage signal of the waveform desired at the output. In one preferred embodiment, the waveform is sinusoidal and the waveform generator includes controls for selecting the amplitude and frequency of the input and therefore of the output.

The amplifier is provided with a positive load switch generally indicated as 20 and a negative load switch generally indicated as 22. Each load switch 20, 22 is characterized by controlled current flow in one direction and uncontrolled (flyback) current flow in the other direction. Each load switch is respectively connected to one of the power supply rails 21, 23 and the outputs are tied together and fed into an inductor 25.

Inductor 25 is further coupled to the junction of output lead 35a and output capacitor 32. Output capacitor 32 serves to smooth and filter the output voltage. Additionally, the junction between each load switch 20, 22 and the associated power supply rail 21, 22 is coupled to the junction of output capacitor 32 and output lead 35b through a flyback current capacitor 27, 28. A tap is taken from the output through a voltage dividing assembly 30 (shown in FIG. 1 as a voltage divider having resistors 30a and 30b) and is coupled to output feedback input 19 of logic control unit 10.

Logic control system 10 is coupled at its positive and negative supply inputs 13, 14 to rails 21, 23, respectively. Each load switch is provided with a conduction feedback circuit 20a, 22a respectively coupled to a switch feedback input 15, 16 of logic control unit 10. Controlled actuation of load switches 21, 23 is effected by switch control outputs 17, 18 of logic control unit 10.

In one embodiment, the logic control may incorporate a high speed precision comparator which is used to determine if the input signal is of a higher or lower voltage than the output feedback signal. The output of the comparator is then treated as an indication as to which inductive load switch should be turned on. The logic control determines if the proper switch is turned on, and if it is, the logic control will go back and sample the comparator output repetitively until a change is required. At that point, the logic control will turn off the then driven switch and wait until it stops conducting. A current "flyback" then occurs between the inductor and the opposite flyback capacitor, through the opposite switch in its uncontrolled direction. This flyback occurs due to the electromagnetic properties of the flyback assembly, the flyback current flowing from the inductor to the opposite capacitor associated with the just turned off switch. For example, after positive switch 20 stops conducting, flyback current flows from inductor 25 to flyback capacitor 28 and output capacitor 32.

After flyback occurs, the previously non-operating switch is "turned on". This switch will now stay on until the output voltage reaches the desired level. The output feedback voltage applied to the comparator is compared to the input voltage and when the output once again crosses the input, the entire switching process is repeated. In other words, the output is first driven, by way of example, to a higher level until output feedback exceeds the input as determined by the comparator. Then, after positive switch 20 is turned off and flyback occurs, (flow of flyback current from inductor 25 to flyback capacitor 28 through switch 22), switch 22 is turned on and the output driven to a lower level until the output feedback voltage is lower than the input voltage. The output is thus cyclically and rapidly driven in a manner which tracks the input to effect amplification. If the input is sinusoidal, the output is sinusoidal with a ripple.

Figure 4:
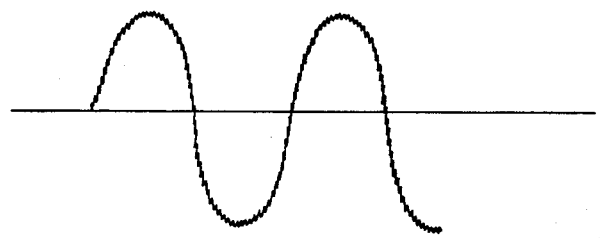
FIG. 4 is a waveform diagram of an output voltage of an amplifier made in accordance with the invention.

The "tracking" of the input waveform by the output voltage is illustrated in FIG. 4. Assuming the input waveform is sinusoidal, the output is a sinusoidal wave which has a voltage swing dependent on the amplitude of the input signal and a frequency equal to the frequency of the input signal. Additionally, as can be seen in FIG. 4, the output voltage is not a smooth sinusoidal wave but rather is made up of a series of ripples. These ripples represent the alternate overdriving and underdriving of the output voltage by logic control 10 as the positive and negative power switches 20, 22 are alternately turned on. Since it takes a finite time for the inductor to discharge and for the positive and negative power switches to turn on and off, the arrangement will overdrive the output signal just slightly before flipping to the opposite switch. This results in an output signal which is a practical equivalent of a "perfect output signal", but which is synthesized by a series of small voltage steps. By way of example, the frequency of the sinusoidal wave can be 60 Hz or 400 Hz while the frequency of the ripple on the order of 120 kilohertz or 1 megahertz.

Since the comparator will never indicate that the two inputs are exactly equal, the logic control unit will try to run the amplifier at the fastest speed that the logic control can handle. However, the flyback feedback signals will allow the amplifier to switch at whatever speed is "comfortable" for the entire system.

In effect, the logic control unit operates the switches in an extremely efficient combination of pulse width and frequency modulation modes. The system is designed to allow switching to occur rather than forcing the transition from one switch to the other as in the prior art switching power amplifiers. Inductor 25 tends to create the precise switching timing needed to determine that inductor 25 is fully discharged and the first turned off switch has fully recovered before the other switch is even turned on. Additional factors which determine switching frequency and duty cycle are input voltage, input signal and output load. The arrangement in accordance with the invention becomes "self-adjusting" to accommodate changes in these factors and the inductor.

It is noted that a unique feature of the flyback modulated amplifier is that the power output switches 20, 22 are never exposed to switching transients similar to those found in other switching amplifier systems. Only the actual inductor current passes through the power switches, and this current is always in phase with the inductor. This yields a system which automatically "tunes itself" to compensate for possible circuit variations including unmatched power components and extreme supply voltage ripple. In addition, the system throughout efficiency can achieve up to 98% at 20 to 80% of the rated capacity.

As noted above, switches 20 and 22 may be of any design as long as they provide a controllable current flow in one direction and an uncontrolled current flow in the opposite direction. The conduction feedback circuit of each switch may be formed from a magnetically coupled arrangement using a pulse transformer responsive to a higher voltage across the switch terminals. Alternately, a resistor and light emitting diode assembly may be used as the flyback feedback current detector to drive a photodiode assembly for an optically coupled feedback arrangement.

Figure 2:
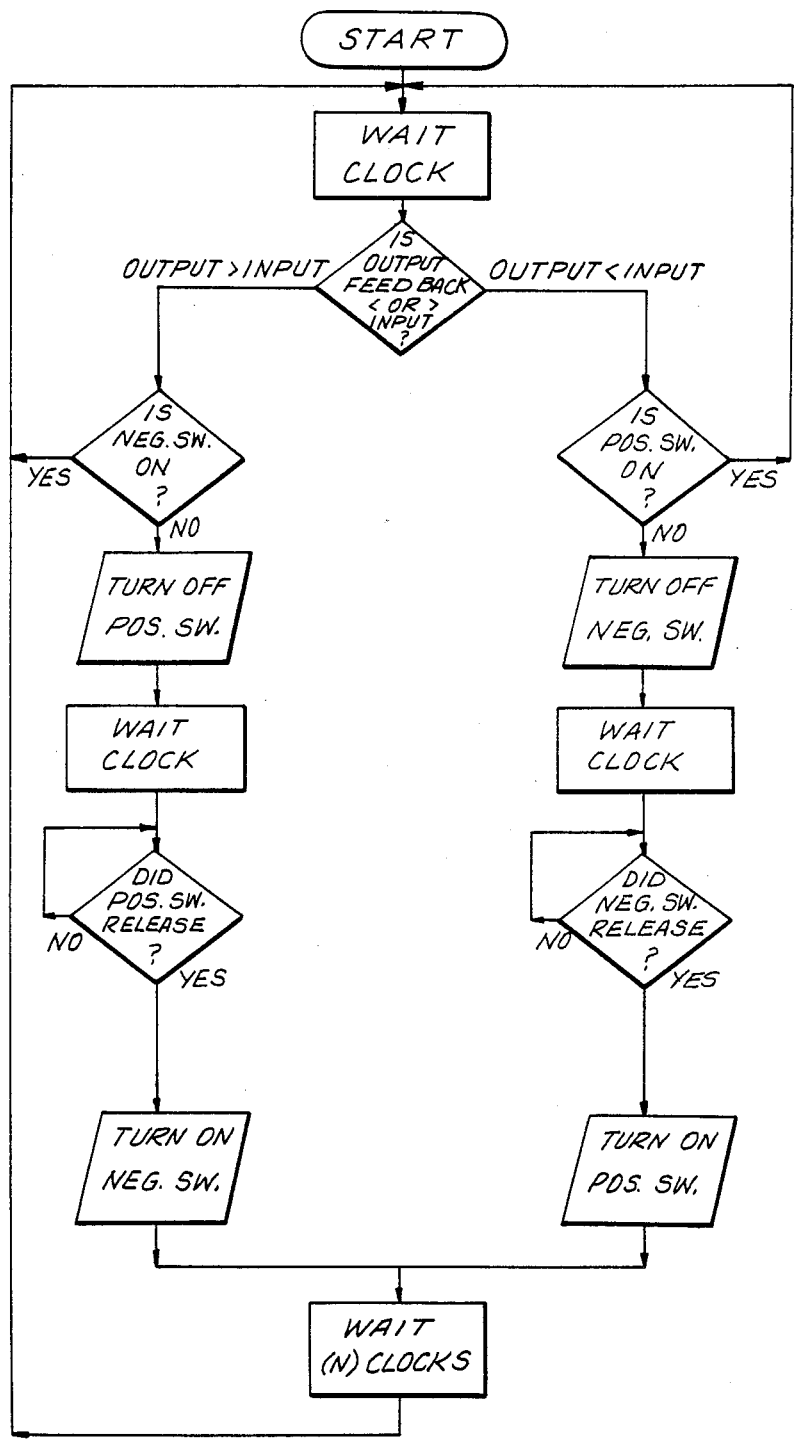
FIG. 2 is a flow chart of the logic control of the invention.

Referring now to FIG. 2, a flow diagram of one embodiment of the logic control in accordance with the invention is provided. The logic control unit first goes through a wait cycle for synchronization purposes. The next step is to compare the output feedback signal 19 with the input voltage 11. Since these two are treated in the comparison step as never equal, the output will either be less than the input or will be greater than the input. If the divided output voltage is greater than the input voltage, then the logic determines whether the negative power switch is on. If the negative switch is in the desired on state, the negative switch will drive the output signal in the negative direction. If the negative switch is on, the control then goes through another wait cycle and again compares the divided output voltage to the input voltage. This continues until the output voltage is then less than the input voltage. At this point, the logic checks to see whether the positive switch is on. If the positive switch is not on because the negative switch is on, the logic turns the negative switch off and then, after a wait cycle, checks to see if the negative switch actually released and if flyback has been completed. If the negative switch did not release or flyback is not completed, then the logic goes through another wait cycle. Once the negative switch releases and flyback occurs, the logic then turns on the positive power switch. The logic then waits for a somewhat larger wait cycle to insure flyback in a minimum duty cycle and then starts the procedure all over again. Now the amplifier will be driving the signal in a positive direction and at some point the divided output voltage will then be greater than the input voltage. At this point the logic will determine if the negative switch is on. Since the negative switch is not on, but rather the positive switch is on, the logic will turn the positive switch off. The logic will then wait a cycle and check to see whether or not the positive switch has released and if flyback has been completed. If the positive switch has not released or flyback has not been completed, the logic will continue to wait until that is done and will then turn on the negative switch to begin driving the output in a negative direction. The logic will then wait out the rest of the clock cycle and will being cycling through the process all over again. The detection of conduction of a switch for driving a flyback is by the conduction feedback circuits 20a and 20b fed back to inputs 15 and 16, respectively of logic control 10.

Figure 3:
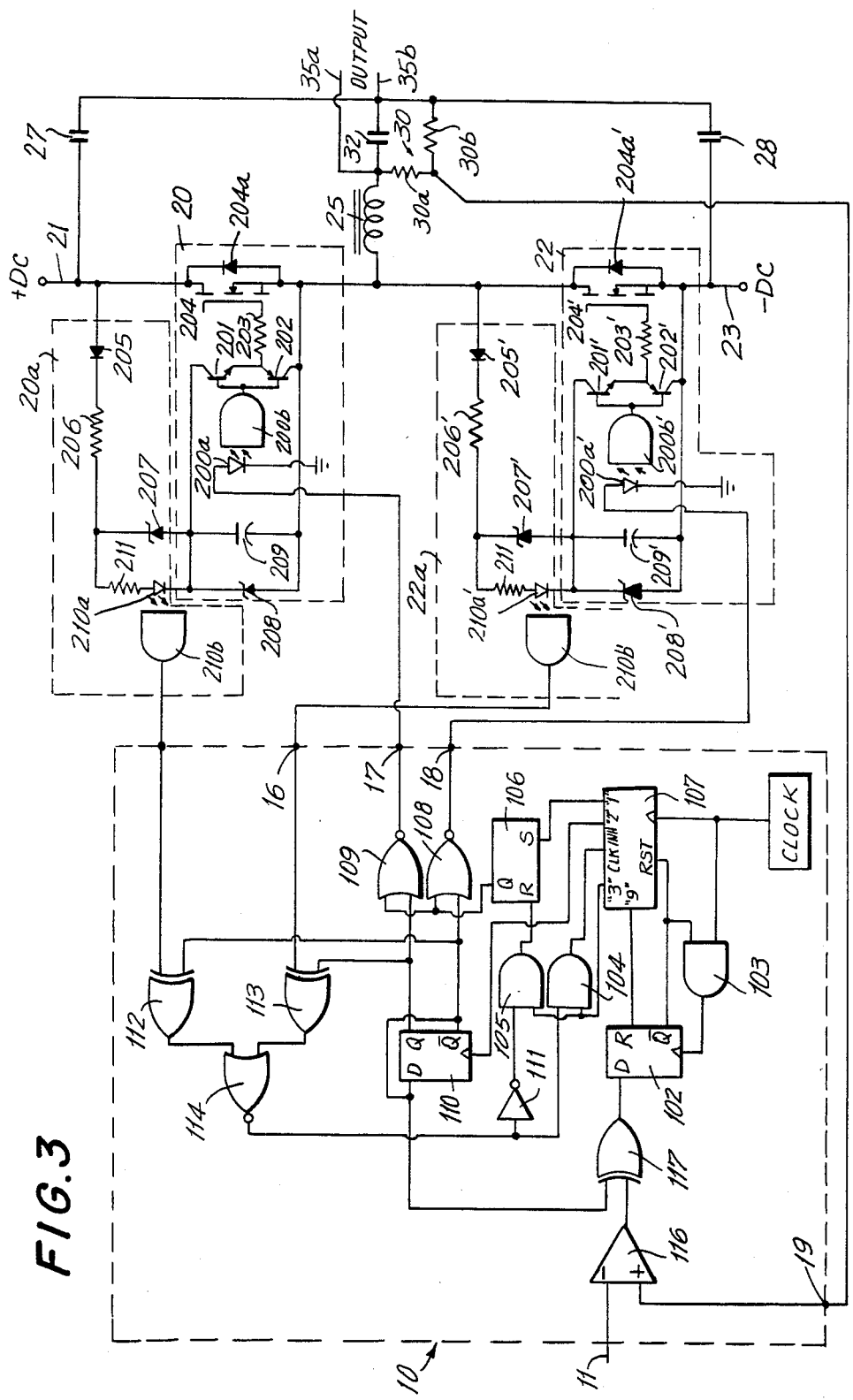
FIG. 3 is in part a logic diagram and in part a circuit diagram of one embodiment of the invention of FIG. 1.

Referring now to FIG. 3, a part logic, part circuit diagram of one embodiment of the flyback modulated power amplifier of FIGS. 1 and 2, the sequence of operation is now described. Comparator 116 compares the input voltage from the waveform generator with the divided output voltage and provides a corresponding signal to an XOR gate 117. The second input to gate 117 is not the NOT Q output of flip flop 110. Gate 117 will indicate whenever a change is required by providing a "1" at its output, which is coupled to the D input of flip flop 102. On the next sampling clock, as fed by gate 103, the NOT Q output will be reset. This in turn will release the reset input of counter 107 and turn off the sampling clock pulses through gate 103. At this point the counter then clocks to step 1. At step 1, flip flop 106 is set, which disables the output from NOR gates 108 and 109 to load switches 20 and 22 to turn off the switches. The clock then steps to step 2. At step 2 the opposite direction is clocked into flip flop 110 so that when the outputs of NOR gates 108, 109 are enabled, they will reflect the new direction. The counter then cycles to step 3 during which the output of the conduction feedback circuits 20a and 22a are sampled. Specifically, if the Q and NOT Q outputs of flip flop 110 indicate that positive switch 20 should be driven and negative switch 22 should be cut off, XOR gate 113 is sampled and applied to NOR gate 114 the output of which is applied to AND gate 105 through inverter 111 and directly to AND gate 105. When negative switch 22 is conducting, even if the conduction is only flyback current, XOR gate 113 conducts causing NOR gate 114 to conduct, to in turn cause AND gate 104 to conduct to inhibit the clock of counter 107 until flyback occurs. Thereafter, XOR gate 113 is closed, AND gate 105 conducts to reset flip flop 106 to release NOR gates 108 and 109 and AND gate 104 closes to release the clock to advance counter 107 to the step 9, providing a wait step. At this state the setting of flip flop 110 causes NOR gate 109 to open to apply a positive switch drive signal to output 17. In step 9 the system is kept steady and the chosen switch remains on. Flip flop 102 is released to detect the next change in output of comparator 116. Finally, this in turn sets the counter 107 into a wait state by holding the reset line until the system begins to cycle again by a changed output from comparator 116.

In the next cycle XOR gate 112 is enabled to detect the complete end of conduction of switch 20 and thereafter NOR gate 108 is opened to apply a negative drive signal to output 18. Logic control circuit 10 can be formed of an integrated circuit chip.

Operation of the switches and conductor feedback circuit will now be described with reference to the positive switch and feedback circuits 20 and 20a. The negative switch and feedback circuits function in a similar manner and the like parts have been assigned like prime numbers primed.

When NOR gate 109 conducts indicating that positive switch 20 is to turn on, light emitting diode 200a conducts, causing photo-activated gate 200 to conduct. When gate 200b is switched on, transistor pair 201 and 202 are activated to provide a switching current through resistor 203 to the gate of MOSFET switch 204. Switch 204 is a power MOS switch having an internal body-drain diode. An example of such a switch is the HEX MOSFET IRF 120 100 volt 0.30 transistor manufactured by International Rectifer. The switching of the MOSFET switch allows a voltage to flow through feedback diode 205. This voltage is then current limited by resistor 206 and the voltage is also regulated by Zener diode 207. The feedback is applied through resistor 211 to voltage light emitting diode 210a to light same, which in turn produces an output at photo-activated gate 210b. The output of photo-sensitive gate 210b provides a feedback to positive feedback input 15 of logic control 10. Switch 204 includes an inherent diode 204a which permits uncontrolled conduction in the direction opposite to the direction of controlled power conduction. Flow of flyback current from inductor 25 through inherent diode 204a is also detected at feedback circuit 20a to light emitting diode 210a.

Figure 5:
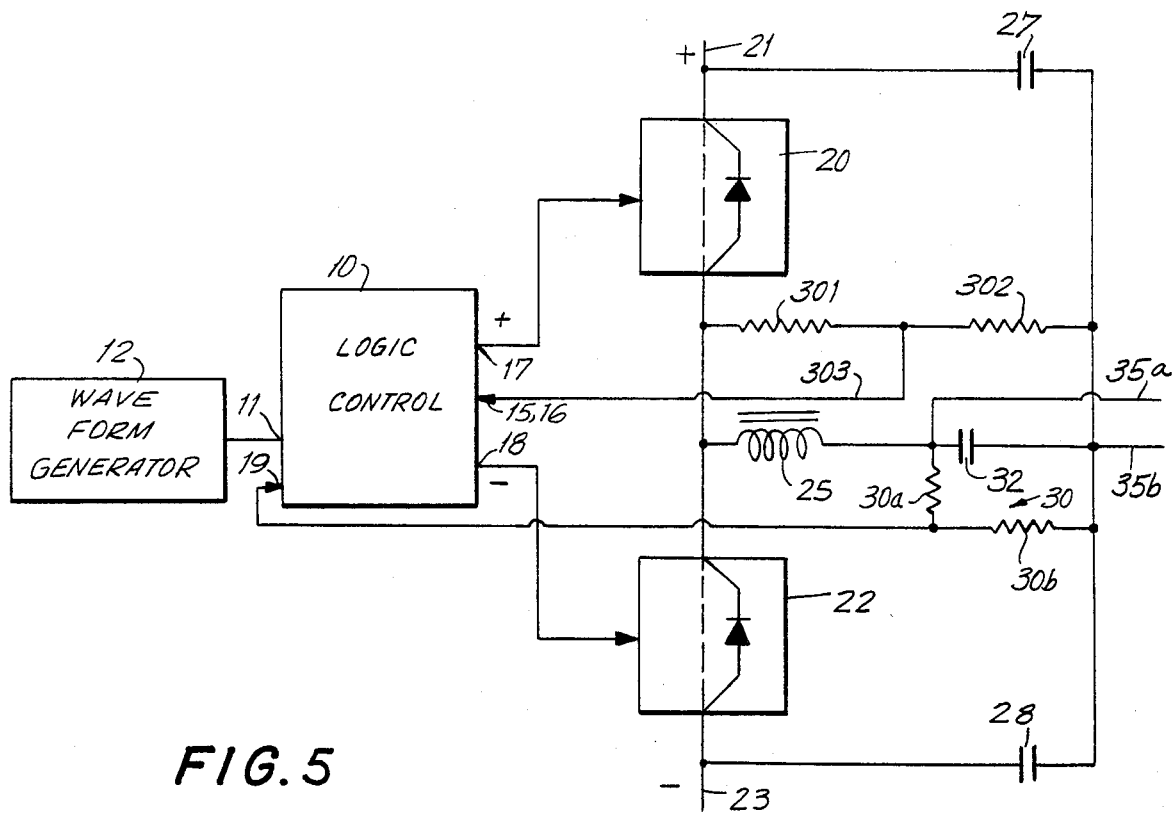
FIG. 5 is a block diagram of a further embodiment of the invention.

Referring now to FIG. 5, an alternate embodiment of the flyback modulated switching amplifier in accordance with the invention is shown, like reference numerals being applied to like elements from FIGS. 1 and 3. The circuit differs from FIG. 1 in the conduction feedback circuit. Specifically, resistor 301 and resistor 302 are connected in series between the junction of the two power switches and the junction between flyback capacitors 27 and 28. They act as a voltage divider and a tap 303 is taken at their connection as the conduction feedback input 15, 16 to logic control 10. The signal on line 303 will swing between the positive rail voltage and the negative rail voltage, or some fraction thereof, depending on the value of the voltage divider, based on the state of conduction of the two power switches. If the positive power switch is conducting due to flyback or being driven, then the signal on the conduction feedback line 303 will be positive. On the other hand, if the negative switch is conducting for any reason, the signal on the conduction feedback line 303 will be negative. In this way the logic control will always have an indication of whether each switch is conducting, either under control or uncontrolled, by detecting the polarity at the conduction feedback input 15, 16.

In the arrangement in accordance with the invention, logic control 10 can also be designed to respond to the occurrence of flyback rather than only the non-conduction state of the "other" switch, before turning on a switch. In essence, the arrangement requires that flyback occur before the switch to be driven is turned on, although technically, the flyback current itself "turns on" the switch to be driven. For example, if the positive switch was conducting and is turned off, flyback is through the negative switch. If the comparator then reveals that the output voltage was immediately taken below the desired level and that positive driving is required, the positive switch will not be driven until current stops flowing in the negative switch and fly-back to the positive switch occurs.

The flyback modulated switching power amplifier in accordance with the invention can be used as a motor speed controller or switching power supply. In addition, the arrangement can be utilized in audio amplifier circuitry and radio frequency amplifier circuitry.

It will thus be seen that the objects set forth above, and those made apparent from the preceding description, are efficiently attained, and since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features herein described and all statements of the scope of the invention which, as a matter of language, might be said to fall therebetween.

What is claimed is:

1. A flyback modulated switching power amplifier which comprises:
   means for coupling to a power source;
   means for coupling to an input signal;
   means for coupling to an output;
   capacitive means coupled across said output;
   at least two power switch means each capable of controlled conduction in one direction and uncontrolled conduction in the other and connected in series across said power source means;
   inductive means coupled between the junction of said power switch means and said output means;
   voltage comparator means coupled to said output means and input signal means for producing a comparator signal representative of the relative voltage of said input signal and output;
   conduction feedback means coupled to said power switch means for producing a conduction feedback signal representative of the conductive state of said power switch means; and
   logic control means for selectively actuating said power switch means in response to said comparator signal and said conduction feedback signal so that one of said power switch means is not actuated while flyback current is flowing from the inductor means through the other power switch means in the uncontrolled direction and so that said power switch means are activated to cause said output to essentially track said input signal.

2. A flyback modulated switching power amplifier as claimed in claim 1, including flyback capacitor means coupled to said power switch means for receiving flyback current from said inductive means.

3. A flyback modulated switching power amplifier as claimed in claim 1, wherein said means for coupling to said power source means includes positive and negative rails, said switch means including positive and negative power switch means respectively coupled to said positive and negative rails, said inductive means being coupled to the junction of said positive and negative switch means.

4. A flyback modulated switching power amplifier as claimed in claim 3, including a flyback capacitor means coupled to each of said negative and positive power switch means for receiving flyback current from said inductive means and one of said negative and positive switch means after the other switch means is turned off.

5. A flyback modulated switching power amplifier as claimed in claim 3, wherein said conductive feedback signal is representative of the conduction of said power switch means in both the activated and flyback current conducting states.

6. A flyback modulated switching power amplifier as claimed in claim 3, wherein said logic control means actuates the positive power switch means when said comparator signal indicates that the output voltage is too low and the negative power switch means when said comparator signal indicates the output voltage is too high but not until the other switch has ceased conducting flyback current.

7. A flyback modulated switching power amplifier as claimed in claim 6, wherein said capacitive means is an output capacitor across said output.

8. A flyback modulated switching power amplifier as claimed in claim 7, wherein said conductive feedback means includes a voltage divider connected across said inductive means and output capacitor means and a tap off said voltage divider means coupled to said logic control means, the polarity of the conductive feedback signal at said tap being representative of which power switch means is conducting.

9. A flyback modulated switching power amplifier as claimed in claim 6, wherein said conduction feedback circuit means includes means for electrically isolating said logic control means and said power switch means.

10. A flyback modulated switching power amplifier as claimed in claim 9, wherein said isolation means includes a light emitting diode and a photo-activated gate means.

11. A flyback modulated switching power amplifier as claimed in claim 6, wherein said power switch means includes an actuation circuit and means for electrically isolating said actuation circuit and said logic control means.

12. A flyback modulated switching power amplifier as claimed in claim 11, wherein said isolation means includes a light emitting diode and a photo-sensitive gate means.

13. A flyback modulated switching power amplifier as claimed in claim 6, including waveform generator means for selectively producing said input signal.

14. A flyback modulated switching power amplifier as claimed in claim 1, including a waveform generator means for selectively producing said input signal.

15. A flyback modulated switching power amplifier as claimed in claim 6, wherein said power switch means are MOSFET transistor switches having an inherent reverse diode.

16. A flyback modulated switching power amplifier as claimed in claim 6, wherein said logic control means includes means for detecting a change in the comparator signal between the "too low" and "too high" states, means for detecting if the other power switch means has ceased conducting and means for thereafter actuating the desired power means.

17. A flyback modulated switching power amplifier as claimed in claim 6, wherein said logic control means includes a clock actuated counter means for controlling the sequence of operations thereof, the frequency of said clock being substantially greater than the frequency of said input signal.

18. A flyback modulated switching power amplifier as claimed in claim 6, wherein said logic control means is formed of an integrated circuit chip.

19. A flyback modulated switching power amplifier which comprises:
- at least two power switch means capable of controlled conduction in one direction and uncontrolled conduction in the other direction;
- inductive means coupled to said power switch means for receipt of driving current therefrom in the controlled direction for application to an output;
- capacitive means coupled across said output;
- conduction feedback means for producing a conductive feedback signal representative of the conductive state of said power switch means;
- comparator means for producing a signal representative of whether the amplifier output voltage is at a desired level; and
- logic control means for selectively activating said power switch means in response to said comparator signal to maintain said amplifier output at about the desired level and adapted to delay activation of a power switch means in response to the conduction feedback signal, until flyback current from the inductor means through the other power switch means has been completed.

20. A flyback modulating switching power amplifier as claimed in claim 19, wherein said power switch means includes positive and negative power switch means, said inductive means being coupled to the junction therebetween.

21. A flyback modulated switching power amplifier a claimed in claim 20, wherein said logic control means actuates the positive power switch means when said comparator signal indicates the output voltage is too low and the negative power switch means when said comparator signal indicates the output voltage is too high, but not until the other switch has ceased conducting.

* * * * *